United States Patent
Jairazbhoy et al.

(10) Patent No.: US 6,395,087 B1
(45) Date of Patent: May 28, 2002

(54) METHOD AND APPARATUS FOR DISPENSING VISCOUS MATERIAL

(75) Inventors: Vivek Amir Jairazbhoy, Farmington Hills; Jeff (Jin Her) Lin, Canton; John Trublowski, Troy; Vinh Van Ha, Southfield; Zhaoji Yang, Westland, all of MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/359,625

(22) Filed: Jul. 22, 1999

Related U.S. Application Data

(63) Continuation-in-part of application No. 08/716,037, filed on Sep. 19, 1996, which is a continuation of application No. 08/363,806, filed on Dec. 27, 1994, now abandoned.

(51) Int. Cl.$^7$ .................................................. B05C 5/02
(52) U.S. Cl. ......................... 118/406; 118/410; 118/413; 425/461
(58) Field of Search ................. 118/410, 406, 118/413; 101/123; 425/461

(56) References Cited

U.S. PATENT DOCUMENTS

| | | | |
|---|---|---|---|
| 3,181,199 A | * 5/1965 | Voelker | 118/413 |
| 4,040,414 A | * 8/1977 | Suroff | |
| 4,622,239 A | 11/1986 | Schoenthaler et al. | 427/96 |
| 4,720,402 A | 1/1988 | Wojcik | 427/282 |
| 5,133,120 A | 7/1992 | Kawakami et al. | 427/97 |
| 5,191,709 A | 3/1993 | Kawakami et al. | 427/97 |
| 5,556,471 A | * 9/1996 | Boccagno et al. | 118/300 |
| 5,687,882 A | * 11/1997 | Mueller | 222/212 |
| 6,132,510 A | * 10/2000 | Buechele et al. | 118/406 |
| 6,171,399 B1 | * 1/2001 | Kaiser et al. | 118/406 |

* cited by examiner

Primary Examiner—Laura Edwards
(74) Attorney, Agent, or Firm—Brinks Hofer Gilson & Lione

(57) ABSTRACT

A novel apparatus for compressing viscous material through openings in a stencil is disclosed. The novel apparatus has a compress on head cap which provides a contained environment to direct and to aid the flow of pressurized viscous material through the openings in the stencil. In another embodiment of the invention, the compression head includes a viscous material reception chamber which has a certain shape which is effective to cause said received viscous material to be selectively dispensed while having a substantially uniform velocity profile and which further provides for the creation of a substantially uniform pressure profile.

4 Claims, 6 Drawing Sheets

METHOD AND APPARATUS FOR DISPENSING VISCOUS MATERIAL

This application is a continuation-in-part from pending U.S. patent application 08/716,037 (filed on Sep. 19, 1996), which is a continuation of U.S. patent application 08/363,806 (filed on Dec. 27, 1994, and now abandoned).

BACKGROUND OF THE INVENTION

1. Field of the Invention

Embodiments of the present invention relate generally to methods and devices for depositing viscous materials onto a printed wiring board. In one aspect, the present invention relates to methods and devices for compressing viscous materials, such as solder paste, through openings in a perforated substrate, such as a patterned screen or stencil.

2. Description of Related Art

Surface Mount Technology (SMT) involves placing circuit components onto circuit paths embedded on the upper surface of a printed wiring board and then soldering the components in place by a process called "reflow soldering". Before the circuit component is placed on the printed wiring board, however, it is desirable to apply solder paste to the area on the printed wiring board where the component is to be soldered into place.

Conventional methods do exist to deposit ("print") solder paste onto desired areas of a printed wiring board by forcing the paste through openings in a substrate (e.g., a stencil) placed in intimate contact with the printed wiring board.

U.S. Pat. No. 4,622,239 describes such a method and device for dispensing viscous materials. The method includes forcing a viscous material from a housing through an opening and depositing it onto a stencil between a pair of flexible members (parallel squeegee blades) which depend from the housing on either side of the opening and are in contact with the stencil. The ends of the flexible members are not connected and remain open ended. The viscous material, accordingly, is not contained within an enclosed area when it is deposited on the surface of the stencil. Movement of the housing and the flexible members horizontally across the stencil causes the trailing flexible member to force the viscous material through the openings in the stencil. U.S. Pat. No. 4,720,402 describes a similar method and device except that the leading flexible member is raised off of the stencil during movement of the housing.

U.S. Pat. Nos. 5,133,120 and 5,191,709 describe methods for filling through-holes of a printed wiring board via a mask with pressurized conductive filler material by means of a nozzle assembly unit having a nozzle tip member. The nozzle tip member, however, is designed only to dispense the pressurized conductive filler material through the mask to a single through-hole. The nozzle tip member then "scans" the printed wiring board for a second through-hole to fill. The nozzle tip member has a blunt end section which rests on the mask and a circular exit, the diameter of which may be increased or decreased by changing the nozzle tip member. The nozzle tip member dispenses the filler material without controlling unwanted flow of "excessive" filler material back through the stencil. Additionally, the nozzle tip member does not define a contained environment where "compression" of the filler material takes place through the mask followed by the immediate shearing off of the filler material within that contained environment from the surface of the stencil. In fact, the nozzle tip member itself provides no effective means for shearing off filler material from the top of the stencil, rather, after the through hole is filled and filler material "backs up" through the stencil, the nozzle tip member moves forward whereupon the "excessive" filler material is then wiped off by a separate, single, flexible squeegee member which is designed for unidirectional use only.

Unfortunately, these conventional efforts do not provide a contained environment for compression of viscous material through holes in a stencil and shearing of viscous material within the contained environment from the upper surface of the stencil. Reliance upon squeegee movement to force the viscous material, such as solder paste, through the stencil openings can lead to damage and eventual failure of both the squeegee blades and the stencil due to repeated friction. Since conventional efforts do not provide a contained environment in which compression and shearing is accomplished, waste of the viscous material is frequently encountered.

Conventional efforts, therefore, (1) fail to maximize the efficiency of printing solder paste onto a desired area of a printed wiring board and (2) fail to minimize waste of the solder paste during the printing process. A need therefore exists to develop a method for printing solder paste onto a printed wiring board and a device suitable for use therewith which overcomes the deficiencies of the conventional efforts.

Moreover, these conventional methodologies and assemblies do not substantially ensure that the viscous material is dispensed and selectively placed upon the various portions of the circuit board, through the perforated stencil, at a substantially equal velocity. These conventional methodologies and assemblies also do not substantially ensure that the "backpressure" formed within the compression head and/or within or through those portions of the exit aperture overlaying solid or "non-perforated" portions of the stencil and/or overlaying those perforated stencil portions which are filled with paste or viscous material, is substantially identical or uniform. Hence, these conventional methodologies and assemblies provide an undesirable and "non-uniform" velocity and pressure or "backpressure" distribution or "profile". Particularly, a velocity "profile" is the numerical value of the velocity of the emitted viscous material at various locations within the exit aperture which overlay perforated portions of the stencil. A pressure "profile" is the numerical value of the pressure or "backpressure" created through and/or within the various locations of the exit aperture by the exiting viscous material which encounters "solid" stencil portions (e.g., paste filled openings or portions of the stencil having no perforations).

Particularly, the viscous material or solder "paste" is typically and selectively received within a top portion of a compression head through a material reception aperture. The received viscous material is made to travel through the compression head before exiting through an exit aperture or a slotted opening which is usually formed within the bottom portion of the compression head.

Most of the received viscous material traverses through the compression head along a path which is substantially aligned with the reception aperture. This path, in the above-described arrangement, typically lies along the center of the compression head and, more particularly, typically lies between the viscous material reception aperture (e.g., the location where the viscous material enters the head) and the exit opening or exit aperture. The viscous material traveling along this aperture-aligned path selectively emanates from or is selectively emitted from the compression head at a substantially higher velocity than the material which traverses along the various ends or outer wall portions of the compression head, and forms greater amounts of pressure or "backpressure" than the viscous material traveling along these other paths. This non-uniform velocity and pressure distribution or profile causes uneven amounts of the viscous material to be deposited upon the stencil, thereby causing much of the deposited paste or viscous material to be undesirably wasted and concomitantly reducing the overall quality of the printed and created circuit board.

To provide improved pressure and velocity profile uniformity of the viscous material, a series of perforated plates or islands are oftentimes deployed and used within the compression head. These objects are somewhat effective to redistribute the flow of the received viscous material in a manner which causes more of the received viscous material to flow along the end or wall portions of the compression head and to increase the flow resistance along the previously described aperture-aligned path of and/or within the compression head. While these plates or islands do reduce some of the foregoing non-uniformity, they suffer from some drawbacks.

By way of example and without limitation, the use of these plates and/or islands requires that a relatively costly and time-consuming modification of the compression head be made (e.g. the compression head must be "opened" and these objects must be securely fitted or positioned within the head). These plates or islands further cause relatively large pressure losses to occur within the compression head, thereby requiring the viscous material to be communicated to the compression head at a relatively high pressure. This relatively "high pressure injection" arrangement causes the creation of significant amounts of "back pressure" within the compression head. Particularly, this undesirably created "large amount of back pressure" frequently causes the wiper blades to undesirably "lift up" or become disengaged from the surface of the stencil, thereby preventing the blades from properly wiping the stencil of the selectively deposited viscous material and causing circuit boards of an unacceptably poor quality to be created. Further, this required high pressure, in combination with certain "stagnation regions" within the compression head which are generally located between the various perforations or openings in the diffuser plates or islands, causes compaction of the received viscous material and deposition onto the diffusion plates or islands, thereby undesirably "clogging" the flow path and requiring frequent and time consuming maintenance and cleaning of the deployed plates/islands.

There is therefore a need to provide a viscous material compression head which overcomes the various and previously delineated drawbacks associated with prior techniques and assemblies, and which selectively receives and which selectively emits viscous material along and through an exit opening or aperture, the selectively emitted viscous material having a substantially uniform velocity profile, and the compression head assembly having a substantially uniform pressure profile. Particularly, the term "substantially uniform velocity and pressure profile" means that the velocity of the exiting material at each "point" or location of and/or within the viscous material dispensation or exit aperture which overlays a perforated portion of the stencil is substantially equal or similar. That is, the emitted viscous material passes through the exit aperture and enters the stencil perforations at a substantially uniform velocity. Further, the amount of "backpressure" created at various locations within the aperture which overlay "solid" or non-perforated portions of the stencil (e.g., such as "paste filled openings") is also respectively and substantially equal at each such "point" or location within the exit aperture.

SUMMARY OF THE INVENTION

The present invention includes a novel apparatus and method for dispensing viscous material through openings in a stencil. Embodiments of the present invention include a process herein referred to as "compression printing" wherein pressure is applied to a viscous material within a contained environment defined by a compression head cap so as to compress it through openings in a stencil.

The apparatus of the present invention includes a reservoir containing viscous material which is operably connected to a pressure source. The reservoir is in fluid communication with a housing which terminates in a substantially uniform opening defined by a compression head cap formed from contiguous walls. During operation of the apparatus, the compression head cap is placed in contact with a stencil having a plurality of openings therein. The compression head cap and the stencil form a contained environment. The pressure source then applies pressure against the viscous material contained in the reservoir forcing it from the reservoir into the housing and to the compression head cap. The contiguous walls of the compression head cap act to contain and to direct flow of the pressurized viscous material to the top surface of the stencil and then through the openings in the stencil.

It is accordingly an object of the present invention to provide a novel apparatus for compressing a viscous material through openings in a stencil by means of a pressure source. It is a further object of the present invention to increase the efficiency of printing viscous material onto a desired area of a printed wiring board and to minimize waste of the viscous material during the printing process.

According to another aspect of the present invention a compression head is provided which selectively receives and which selectively emits viscous material, and which causes the selectively emitted viscous material to have a substantially uniform velocity profile. Particularly, the compression head includes a chamber having a certain shape. The chamber selectively receives the viscous material and selectively emits the received viscous material. The certain shape is effective to cause the dispensed viscous material to have a substantially uniform velocity profile and to cause a substantially uniform pressure profile to be created.

According to another aspect of the present invention a method is provided to receive and selectively dispense viscous material at a substantially uniform velocity. The method includes the steps of providing a head which selectively receives the material at a certain location within the head and which includes a material dispensation aperture which allows the received material to be selectively dispensed as the received material flows through the head. The method further includes the step of narrowing a portion of the provided head, effective to cause the material to be selectively dispensed at a substantially uniform velocity along the material dispensation aperture.

Other objects, features or advantages of the present invention will become apparent -from the following description taken in conjunction with the accompanying drawings.

BRIEF DESCRIPTION OF THE DRAWINGS

In the course of the detailed description of certain preferred embodiments to follow, reference will be made to the attached drawings, in which.

DESCRIPTION OF CERTAIN PREFERRED EMBODIMENTS

The principles of the present invention may be applied with particular advantage to obtain an apparatus for compressing a viscous material through openings in a stencil, preferred embodiments of which may be seen at FIGS. 1, 2, 3, 4, and 5 which are described more fully below.

Figure 1:
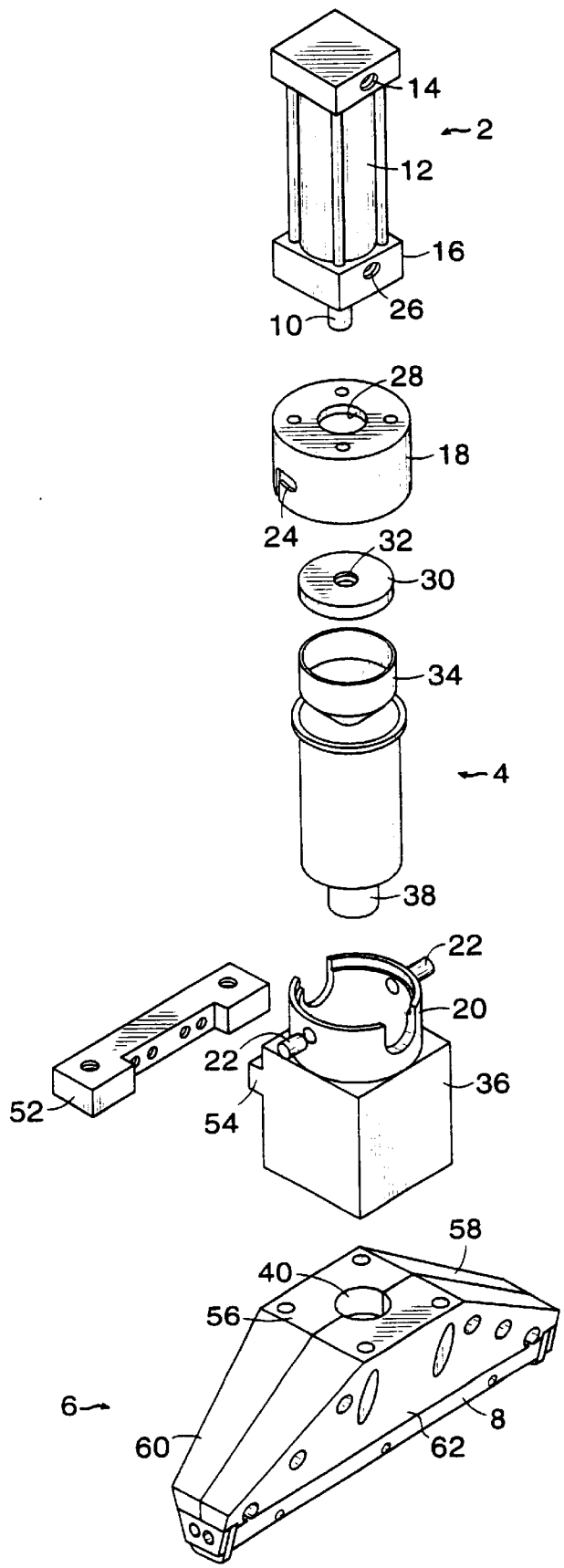
FIG. 1 is a perspective view of the apparatus of the present invention, partially exploded.

FIG. 1 is a partially exploded perspective view of one embodiment of the apparatus of the present invention. As can be generally seen at FIG. 1, the apparatus has a pressure source 2 which is operably connected to a reservoir 4 containing a supply of a viscous material, a compression head 6 and a compression head cap 8.

More particularly, FIG. 1 shows a pressure source depicted as an air cylinder 2 having a piston (not shown) connected to a rod 10 contained in a cylinder housing 12. Pressure inlet 14 allows for the introduction of air pressure at the top of air cylinder 2 thereby displacing the piston causing piston rod 10 to move downward. The air cylinder 2 is mounted via base 16 to cylinder mount 18 which in turn is removably mounted to casing 20 via a twist socket connector having posts 22 and socket grooves, one of which is shown at 24. Base 16 has air inlet 26 for the introduction of air pressure at the bottom of air cylinder 2 thereby displacing the piston causing piston rod 10 to move upward.

Piston rod 10 extends through opening 28 of cylinder mount 18 and is fixedly connected to syringe pusher 30 at contact 32 which in turn engages displacement piece 34 which is movably disposed within syringe 4 which contains a viscous material. Displacement piece 34 acts as a plunger and is designed to mate with the interior of syringe 4 to ensure effective displacement of viscous material with minimal waste. Pressure source 2 is designed to mechanically meter out viscous material through operation of the syringe pusher 30 on the displacement piece 34. The syringe pusher 30, displacement piece 34 and syringe 4 are all vertically housed in operative fashion within the cylinder mount 18, the casing 20 and the syringe housing 36.

The vertical arrangement of the pressure source 2 and the syringe 4 containing the viscous material is a preferred arrangement which advantageously provides for even and direct pressure in metering out the viscous material onto the top surface of a stencil. It is to be understood that pressure source 2 is not limited to an air cylinder of the type depicted in FIG. 1, but that other suitable pressure sources may be used by one of ordinary skill in the art based upon the teachings of the present invention. Such pressure sources include those which mechanically, electrically, or hydraulically operate a mechanical force, such as a piston rod and displacement piece, to meter out viscous material from a syringe housing or other reservoir which contains viscous material. In addition, pneumatic pressure may be used directly to force viscous material from a reservoir housing. Also, pressure source and reservoir configurations other than the vertical configuration depicted in FIG. 1 are useful in the present invention. Such configurations include side-mounted reservoirs and pressure sources or other configurations readily known to those skilled in the art.

The syringe 4 is preferably a disposable unit which can be replaced when desired by disconnecting cylinder mount 18 from casing 20 via the twist socket connector, removing the syringe and replacing it with an alternate syringe. Examples of disposable syringes useful within the teachings of the present invention include those which are readily commercially available from Methods Engineering, Vauxhall, N.J. The cartridges may be purchased pre-filled with suitable viscous materials or they may be purchased empty and then filled with suitable viscous materials, such as solder pastes, which are useful within the practice of the present invention. Useful solder pastes may be readily commercially available from Alpha Metals, Jersey City, N.J.

Typical solder pastes useful with surface mount technology generally contain an alloy of tin, lead and silver in various proportions in combination with other useful solder paste metals, viscosity agents, flux and/or solvents depending upon the desired use of the solder paste. Solder pastes useful in the present invention will become apparent to one of ordinary skill in the art based upon the teachings herein.

Figure 2:
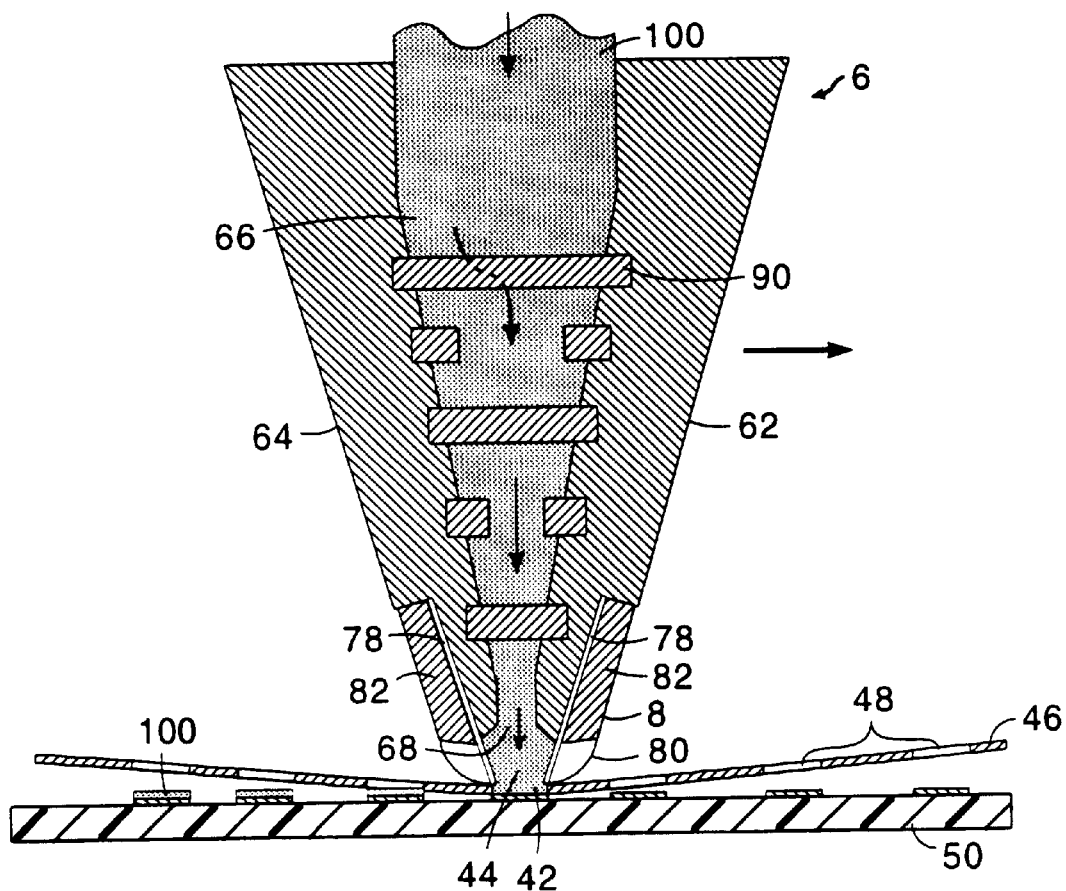
FIG. 2 is a side cross-sectional view of a compression head, a compression head cap, a stencil and a printed wiring board of the present invention showing movement of the solder paste through the compression head, the compression head cap and the openings of the stencil onto the printed wiring board.

The syringe housing 36 is mounted to a housing referred to herein as a compression head generally depicted at 6 in FIG. 1 and shown in a cross-sectional side view in FIG. 2. The syringe 4 has flange opening 38 which is inserted into and mates with first opening 40 of compression head 6 which is described hereafter with reference to both FIGS. 1 and 2 and FIG. 3 which is a bottom perspective view of the compression head cap 8, partially broken away. The compression head 6 terminates in a substantially uniform second opening 42 which is defined by compression head cap 8. The compression head cap 8 is formed from contiguous walls which define a volume 44 within compression head cap 8. The contiguous walls may be either unitary or formed from separate elements and are designed to contact stencil 46 to provide a uniform and substantially flush union with stencil 46 at the point of contact. As can be seen in FIG. 2, stencil 46 has openings 48 and is placed in an operable relationship with a printed wiring board 50. The stencil 46 may be placed in intimate contact with printed wiring board 50 or, as shown in FIG. 2, it may be placed a distance above printed wiring board 50 such that pressure from the compression head 6 forces the stencil 46 into contact with printed wiring board 50. Although stencil 46 is shown in cross-section, it is to be understood that openings 48 may have any desired orientation on stencil 46. Further openings 48 may differ in size depending upon the area of the printed wiring board 50 to be printed with the viscous material. The compression head cap 8 and stencil 46 together form a contained environment 44 for the viscous material during operation of the apparatus of the present invention.

As can be seen in FIG. 1, cross bar mount 52 is attached to syringe housing 36 via flange 54. Cross bar mount 52 is also attached to a mechanism (not shown) for horizontally displacing the apparatus of the present invention along the stencil 46.

The compression head 6 is preferably formed from metal, such as iron or stainless steel or other material suitable for use with pressurized viscous material. The compression head 6 has top surface 56 which serves as the base to which the syringe housing 36 is attached. Side surfaces 58 and 60 extending from top surface 56 slope away from each other as depicted in FIG. 1 to define an increasing length of compression head 6. Front and back surfaces 62 and 64 are contiguous with side surfaces 58 and 60 and slope toward each other as depicted in FIG. 2 to define a decreasing width of compression head 6. The side surfaces join with the front and back surfaces to define a tapered interior chamber 66 as shown in FIG. 2 which acts to restrict flow of viscous material through compression head 6. Interior chamber 66 terminates in generally rectangular exit 68. Compress-on head 6 preferably acts as a nozzle to direct and constrict the flow of viscous material through generally rectangular exit 68. The compression head cap 6 defines a volume 44 surrounding the rectangular exit 68 and into which viscous material flows after exiting the interior chamber 66 of compression head 6. As shown in FIG. 2, the volume 44 is preferably a separate chamber into which the viscous material flows after exiting the interior chamber 66 via rectangular exit 68. The compression head cap 8 defines a generally rectangular opening 42 which is to be contacted with stencil 48. The compression head cap 8 acts to contain and direct the flow of viscous material to the stencil 46. In as, alternate embodiment, it is to be understood that the interior chamber 66 may terminate directly into compression head cap 8 without the need for rectangular exit 68 or volume 44.

Figure 3:
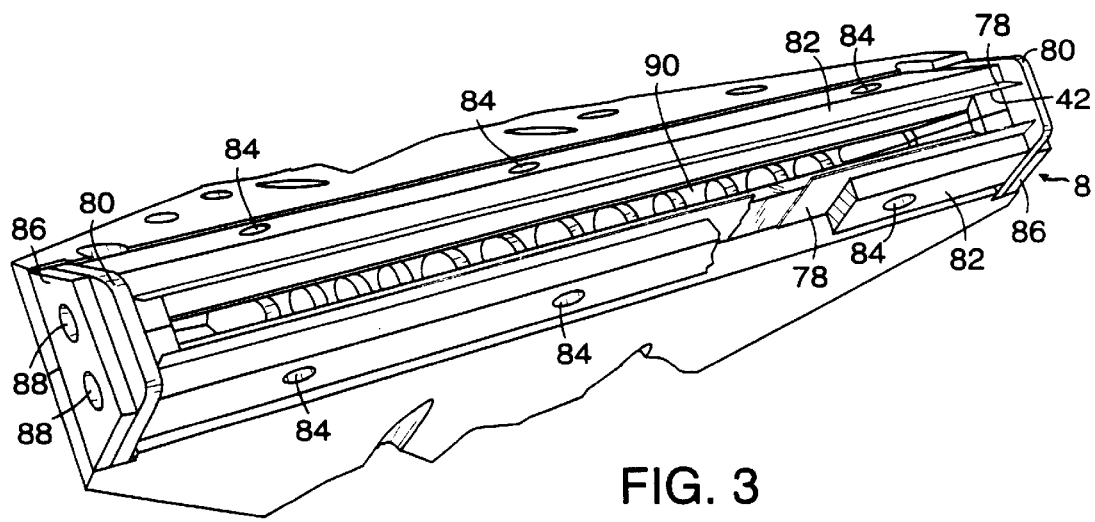
FIG. 3 is a bottom perspective view of the compression head cap of the present invention, partially broken away.
Figure 4:
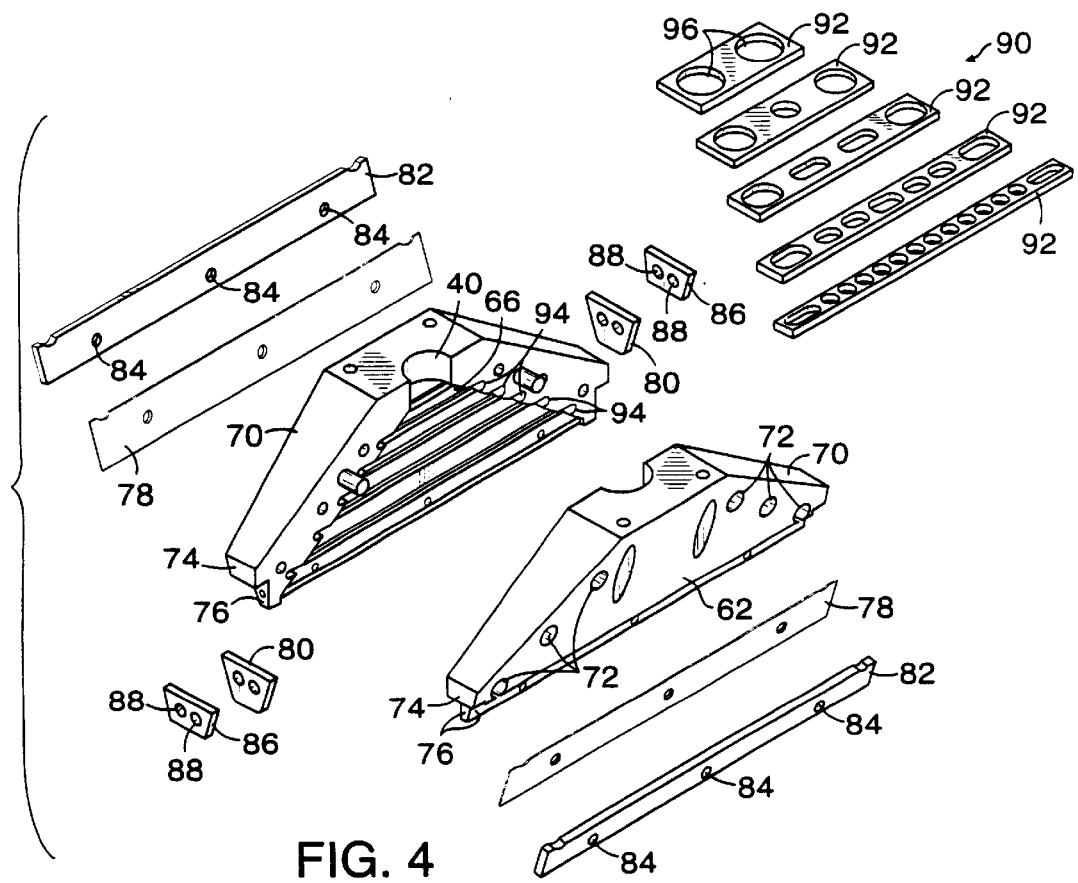
FIG. 4 is an exploded perspective view of the compression head of the present invention showing components of the compression head cap and one embodiment of a diffuser of the present invention.

As can be seen in FIG. 4, the compression head 6 has two half sections 70 which are fixedly connected by screws (not shown) via screw holes 72. The bottom side section 74 of each half section 70 is provided with ledge area 76 to engage the compression head cap 8. As depicted in FIGS. 2, 3 and 4, compression head cap 8 has rectangular blades 78 and end caps 80, which define generally rectangular opening 42. Blades 78 are each fixedly mounted to a corresponding ledge area 76 of front surface 62 and back surface 64, respectively, by means of corresponding rectangular blade holders 82 and screws (not shown) via screw holes 84. Blades 78 each extend along substantially the entire length of corresponding ledge area 76. End caps 80 are attached to a corresponding ledge area 76 of bottom side section 74 via corresponding cap mounts 86 and screws (not shown) via screw holes 88. The end caps 80 are contiguous with blades 78 and together form the compression head cap 8. As can be seen more clearly in FIG. 2, blades 78 parallel the slope of corresponding front and back surfaces 62 and 64, and are, therefore, seen to be angled inward relative to the interior chamber 66 of compression head 8.

Blades 78 are preferably thin and formed from rigid material such as iron or stainless steel. End caps 80 are preferably formed from a flexible substance such as polyurethane to avoid damage to the stencil during operation of the apparatus of the present invention. Cap mounts 86 and blade holders 82 are formed from any solid material capable of securing the corresponding end cap or blade.

While the compression head cap 8 is depicted in FIGS. 2, 3, and 4 as being formed from integral parts, it is to be understood that compression head caps having a unitary structure are within the teachings of the present invention. Such unitary compression head caps are formed from a single rectangular shaped unit and are designed to encircle the ledge area 76 of the compression head 6 or otherwise operatively engage compression head 6. Such compression head caps may be either fixed or removably mounted to the compression head and may have various sizes of opening 42.

The compression head 6 and compression head cap 8, in combination with the pressure source 2 and syringe 4 advantageously provide a vertical down force to move the viscous material evenly and directly to the stencil. The compression head cap 8 of the present invention advantageously provides a contained environment to direct and to aid in the extruding of pressurized viscous material through openings in the stencil. The extruded viscous material is then deposited on the pattern of the printed wiring board. The apparatus of the present invention provides for very high-speed printing capability while maintaining print definition and reduced cycle time. Waste of viscous material is minimized due to the contained environment provided by the compression head cap 8. The length of the compression head cap 8 allows for simultaneous compression printing through a plurality of openings 48 in stencil 46. Furthermore, the trailing blade 78 relative to the direction of operation advantageously operates to shear off the viscous material contacting the stencil within the compression head cap 8 when the apparatus of the present invention is horizontally disposed across the stencil. The blades 78 are rigid and angled to advantageously achieve a smooth shearing of the viscous material. The compression head 6 and compression head cap 8 are advantageously rectangular in shape so that they may operate over a significant area of the stencil with each pass. Additionally, given the dual blade design of the compression head cap 8, the apparatus of the present invention may operate in both the forward and reverse directions thereby improving the efficiency of the compression printing process of the present invention.

As can be further seen in FIGS. 2 and 4, compression head 6 has diffuser 90 which is fixedly mounted within interior chamber 66. Diffuser 90 has a plurality of diffuser plates 92 which are horizontally disposed within interior chamber 66 via grooves 94. Each diffuser plate 92 has a series of openings 96 through which viscous material is to flow. Each opening 96 may be either circular or oblong and decreases in average size as the diffuser plates progress from the first opening 40 to the compression head cap 8. The openings 96 also increase in number as the diffuser plates progress from the first opening 40 to the compression head cap 8. The diffuser 90 advantageously serves to break up the flow of viscous material and evenly and uniformly distribute it from side to side of the rectangular exit 42. The diffuser 90 may also serve to reduce the velocity of the viscous material flowing through the compression head and increase the static pressure of the viscous material which aids in the compression printing process.

Figure 5:
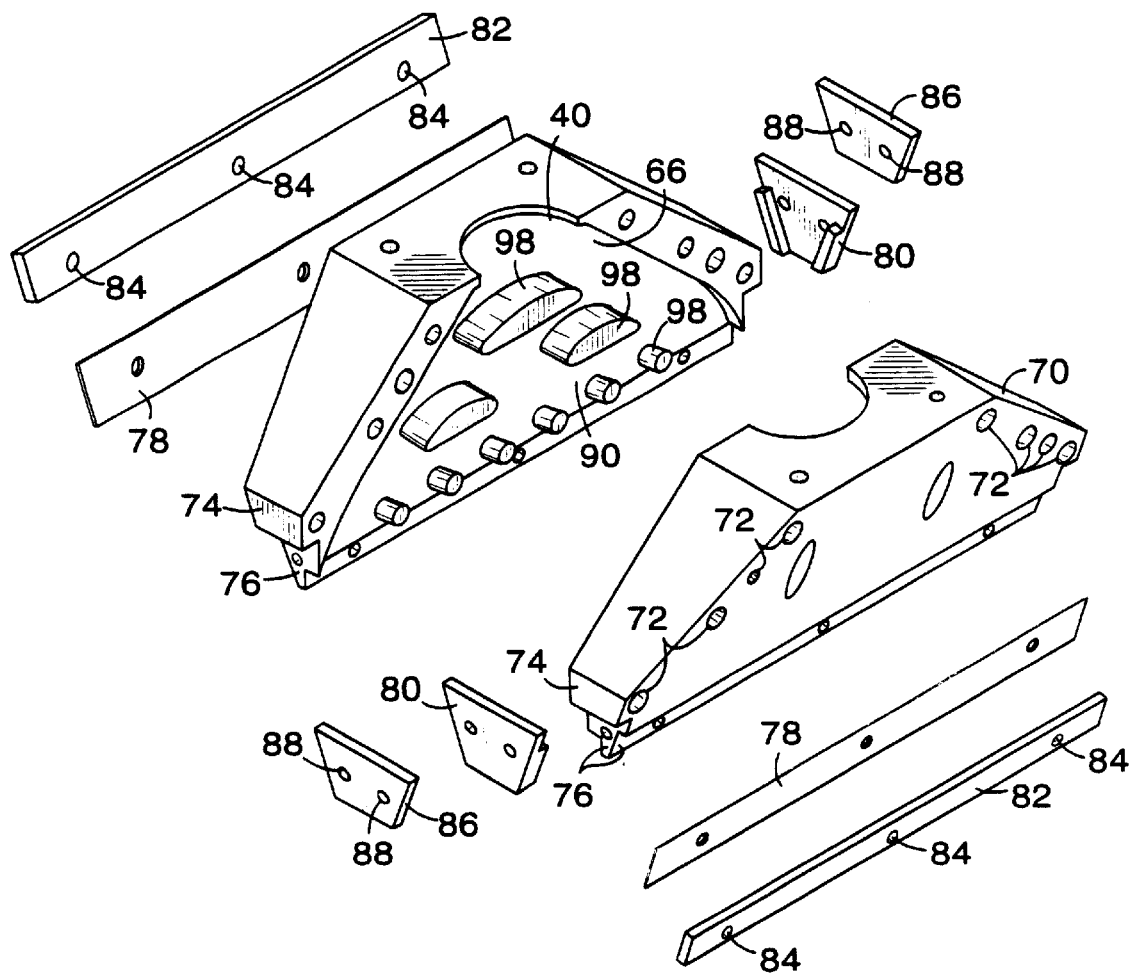
FIG. 5 is an exploded perspective view of the compression head of the present invention showing components of the compression head cap and a second embodiment of a diffuser of the present invention.

FIG. 5 shows an alternate embodiment of a diffuser 90 useful in the present invention. The diffuser 90 has a plurality of diffuser islands 98 which are horizontally disposed in rows within interior chamber 66. The diffuser islands 98 may be fixedly installed within the interior chamber 66 or they may be molded directly within the interior chamber 66. As with the diffuser 90 of FIG. 4, each diffuser island 98 acts to break up the flow of the viscous material and uniformly and evenly distribute it from side to side of rectangular exit 42. The diffuser islands may be either circular or oblong and decrease in average size as the rows progress from the first opening 40 to the compression head cap 8. The diffuser islands 98 also increase in number as the rows progress from the first opening 40 to the compression head cap 8. The diffuser islands 98 of the present invention are advantageous in that they provide for ease of fabrication of the compression head and ease of cleaning.

Operation of the apparatus of the present invention is now described as follows with reference to FIGS. 1 and 2. When compression printing according to the teachings of the present invention, the compression head cap 8 of the apparatus of the present invent-on is brought into contact with the top surface of stencil 46 which forces the stencil downward until it is in intimate contact with the printed wiring board below as shown in FIG. 2. The apparatus is then moved in a horizontal direction, as shown in FIG. 2, across the stencil 46.

During movement of the stencil, pressure source 2 acts on syringe 4 to force viscous material 100 from the syringe 4 into the interior chamber 66 of compression head 6 where it is diffused by diffuser 90 and directed to rectangular exit 68. The viscous material then enters volume 44 of compression head cap 8 which provides a contained environment via blades 78 and end caps 80 to direct the pressurized viscous material under pressure to the top surface of stencil 46. The viscous material is then extruded through openings 48 in the stencil 46 over which the compression head cap 8 travels. The extruded viscous material 100 is thereby printed on the printed wiring board 50. Movement of the compression head cap 8 across the stencil surface causes the trailing blade 78 which is angled inwardly relative to the interior chamber 66 to shear off the viscous material from the top surface of stencil 46. Once the apparatus has traversed the length of the stencil, the apparatus may simply reverse its direction and continue the compression printing process since the compression head cap 8 has dual blades 78 to accomplish the shearing process in either direction of movement.

Operating variables of the apparatus of the present invention, such as run speed and pressure, may be adjusted to accommodate either viscous materials having a wide range of viscosities or stencils with holes having a wide range of diameters. The following data in Table 1 is representative of the parameters at which the apparatus has successfully operated. Print speed is measures in inches per second, air pressure is measured in pounds per square inch, viscosity of the solder paste is measured in centipoises per second, stencil apertures are measured in inches, and the particle sizes of the solder pastes used are between 10-37 microns.

TABLE 1

| Print Speed (inches/sec.) | | Air Pressure | | Viscosity (inches) | | Aperture | |
|---|---|---|---|---|---|---|---|
| Low | High | (psi) | (cps) | Low | High | Low | High |
| 0.94 | 1.26 | 20 | | 850K | 1.0M | 0.0055 | >0.025 |
| 1.45 | 1.70 | 20 | | 850K | 1.0M | 0.0055 | >0.025 |
| 2.27 | 2.31 | 20 | | 850K | 1.0M | 0.0055 | >0.025 |
| 3.10 | 3.89 | 30 | | 850K | 1.0M | 0.0055 | >0.025 |
| 4.20 | 4.77 | 30 | | 850K | 1.0M | 0.0055 | >0.025 |
| 5.98 | 6.62 | 40–50 | | 850K | 1.0M | 0.0075 | >0.025 |
| 6.69 | 7.23 | 50–60 | | 850K | 1.0M | 0.0075 | >0.025 |
| 7.70 | 12.00 | 50–60 | | 850K | 1.0M | 0.0075 | >0.025 |

TABLE 1-continued

As indicated by the above data, the apparatus of the present invention successfully operated over a wide range of print speeds, air pressures and stencil openings. The compression printing method disclosed herein advantageously provides for quicker print speeds, better quality of printing, and less waste of solder paste material than is encountered with conventional printing methods.

Referring now to FIGS. 6–9, there is shown a compression head 200 which is made in accordance with the teachings of a second embodiment of the invention. Particularly, compression head 200 includes a pair of opposed trapezoidal side surfaces 220, 222 which integrally and contiguously cooperate with side surfaces 216, 218 to form a viscous material reception cavity 204 of a certain shape. cavity 204 terminates into and/or integrally forms a viscous material dispensation aperture or "slotted" type opening 206 which is operatively positioned upon and/or is formed within the generally planar bottom surface 207 of head 200. Particularly, surface 207 is integrally formed with the opposed side surfaces 216, 218, 220, 222.

Additionally, head 200 further includes a viscous material reception aperture 208 which communicates with the cavity 204 and which is formed upon the top surface 209 of the neck portion 205. As shown, neck portion 205 is cooperatively and integrally formed with the side surfaces 216, 218, 220, 222. Further, as shown, neck 205 has a substantially square cross sectional area. It should be realized that neck 205 and aperture 208 may have respective shapes which differ from those shown in FIGS. 6–10 and that such alternate shapes may include, without limitation, a circular shape, a rectangular shape, and/or a trapezoidal shape. It should be further realized that in one non-limiting embodiment, each of the side surfaces 216, 218, 220, 222 are substantially identical. However, in the most preferred embodiment, surfaces 220, 222 are substantially similar and surfaces 216, 218 although substantially similar are dissimilar from surfaces 220, 222. These pairs of similar surfaces 220, 222; and 216, 218 cooperatively form a desired shape of cavity 204.

In operation, viscous material, such as solder paste, is selectively communicated from a source (not shown) into the cavity 204, through the material reception aperture 208. The received viscous material travels through the cavity 204 before being emitted from or exiting the compression head 200 through aperture 206. As earlier explained, aperture 206 is typically, selectively, and movably positioned above a stencil which is to operably receive the selectively emitted viscous material in the manner previously discussed. At least one blade 211 is positioned along surface 207 in close proximity to aperture 206 and selectively wipes a certain portion of the deposited viscous material from the stencil surface in a manner and for the reasons which have also been previously discussed.

As seen below, the compression head 200 has a certain shape which causes the selectively emitted or exiting viscous material to emanate from the head 200 at a substantially uniform velocity, along and/or at various locations within the exit aperture 206, without the use of islands or other objects. The shape of the compression head 200 further allows and/or causes the creation of a substantially uniform pressure profile. Hence, the shape of the compression head 200 allows for an improvement in the non-uniformity of the velocity profile of the emitted viscous material and of the created pressure profile, while obviating the need for those objects which undesirably caused the previously delineated drawbacks. The shape of the compression head 200 therefore provides improvement in the overall quality of the produced circuit boards.

Particularly, in this second embodiment, the central portion 210 of cavity 204 which is aligned with aperture 208 and the throat 205 (e.g. in this non-limiting embodiment portion 210 lies substantially below aperture 208 and throat 205), has a relatively narrow and generally rectangular cross-sectional area while the two opposed cavity end wall portions 212, 214 are substantially wider than portion 210 and have generally flared cross-sectional areas. Cavity portions 210, 212 and 214 therefore cooperatively form a substantially "bow-tie" shaped cavity 204 having cross-sectional areas which are each of a substantial "hour-glass" shape. Further, in this embodiment, cavity portions 210, 212, 214 taperingly extend through the head 200 from about the neck 205 to the exit slot or opening 206. The rate of taper of portion 210 is greater than the respective rate of taper of portions 212, 214. In one non-limiting embodiment, the rates of taper for each portion 212, 214 is substantially equal. Hence, cavity 204 forms substantially "hour glass" shaped cross sectional areas which becomes narrower as the cavity extends from about the neck 205 to about the slotted viscous material dispensation aperture 206.

Figure 8:
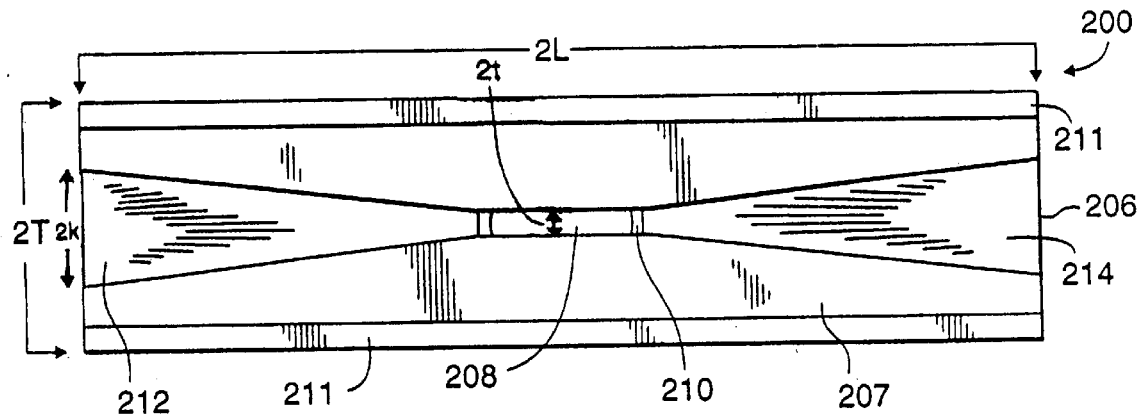
FIG. 8 is a cross-sectional view of the compression head which is shown in FIG. 6 and which is taken in the direction of arrow 8.
Figure 9:
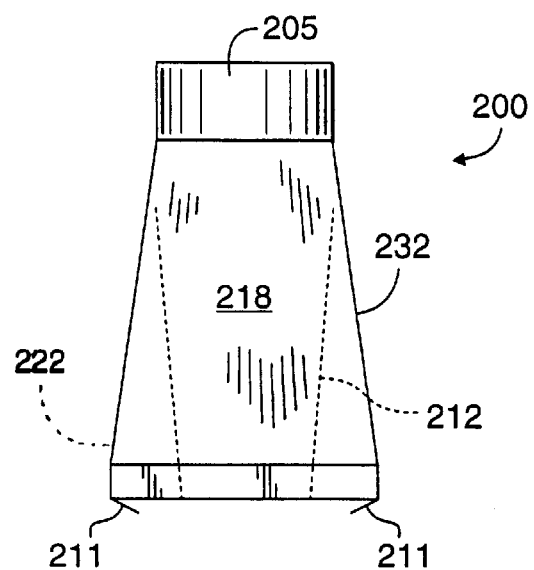
FIG. 9 is a side view of the compression head which is shown in FIG. 6 and which is taken in the direction of arrow 9.
Figure 10:
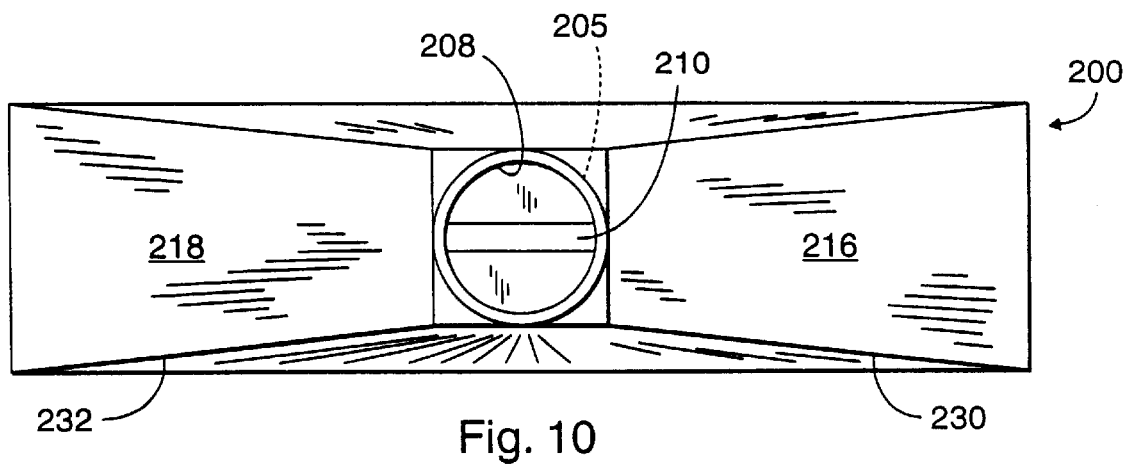
FIG. 10 is a top view of the compression head which is shown in FIG. 9 and which is taken in the direction of arrow 10.

Further, as shown best in FIG. 8, the exit opening or slotted viscous material dispensation aperture 206 also has a substantial hourglass shape and is formed by the tapered cavity 204. In this manner, the flow resistance is increased in the relatively narrow aperture or material reception-portion 210 of the cavity 204 and is effective to cause more of the received viscous material to traverse the cavity 204 along the outer-wall surfaces 216, 218, thereby allowing the exiting viscous material to have and/or create a substantially uniform velocity profile and to cause a substantially uniform pressure profile to be created without the use of perforated islands, plates and/or other objects within the compression head 200. That is, the velocity of the exiting viscous material which enters the various stencil perforations is substantially similar or equal. The "backpressure" which is created at various locations within the aperture 206 is also substantially uniform and equal.

The shape of the compression head 200 and of the cavity 204 may be determined or constructed by various conventional and known software modeling or construction techniques and/or methodologies. The following discussion illustrates one non-limiting approach or technique which may be used to model and/or electronically construct the compression head 200. It should be realized that the following discussion is illustrative of only one such non-limiting methodology or technique and should not be construed to limit the generality of the invention.

1. It should first be noted that in the non-limiting example of the previously described compression head 200, the generally circular material reception aperture 208 has a radius equal to a value of "$w_0$" and transits to a neck 20S having a substantially square cross sectional area forming a width of a value equal to "$2w_0$" along a certain vertical distance of a value equal to "h";

2. It should next be noted that the neck 205 transits to a generally rectangular bottom surface 207. Particularly, surface 207 has a length which is equal to the value of "2L" and a width which is equal to a value "2T". This transition is accomplished in a vertical distance which is equal to a value of "H".

3. The foregoing compression head 200 may therefore be modeled and electronically constructed in the following manner:

a: a substantially symmetrical trapezoid having a height equal to the value of "H", a base of a length equal to a value of "2t" and a top length equal to a value of "$2w_0$" is formed.

B: a second substantially symmetrical trapezoid is formed having a base of a length equal to a value of "2k" and a top of a length equal to a value of "2W". (It should be noted that the value of "W" may be different from the value of "$w_0$"). The second formed trapezoid has a height having a value of "H". These two formed trapezoids (e.g., computer generated and/or electronically generated trapezoids) are electronically and/or mathematically aligned, by the use of conventional modeling techniques and/or software, and form two opposed side surfaces 220, 222 of the compression head 200. These side surfaces 220, 222 are then connected in a conventional electronic/software-modeling manner to form the cavity containment portion of the compression head 200.

c: At the portion of neck 205 which is integrally formed within each of the opposed end walls 230, 232 of surfaces 220, 222), the shoulder of the body is "cut" or adjusted, thereby causing compression head 200 to form an angle between each wall 230, 232 and the neck 205 and having a value of "θ", as shown best in FIG. 6. In the most preferred embodiment, the value of "θ" is equal or slightly larger than $$\tan^{-1}\left(\frac{L-w_0}{H}\right)) \quad \text{Equation 1}$$

d: The formed body of the compression head 200 is "reflected" according to a conventional software and/or electronic modeling technique or methodology about a vertical center plane of symmetry.

Figure 6:
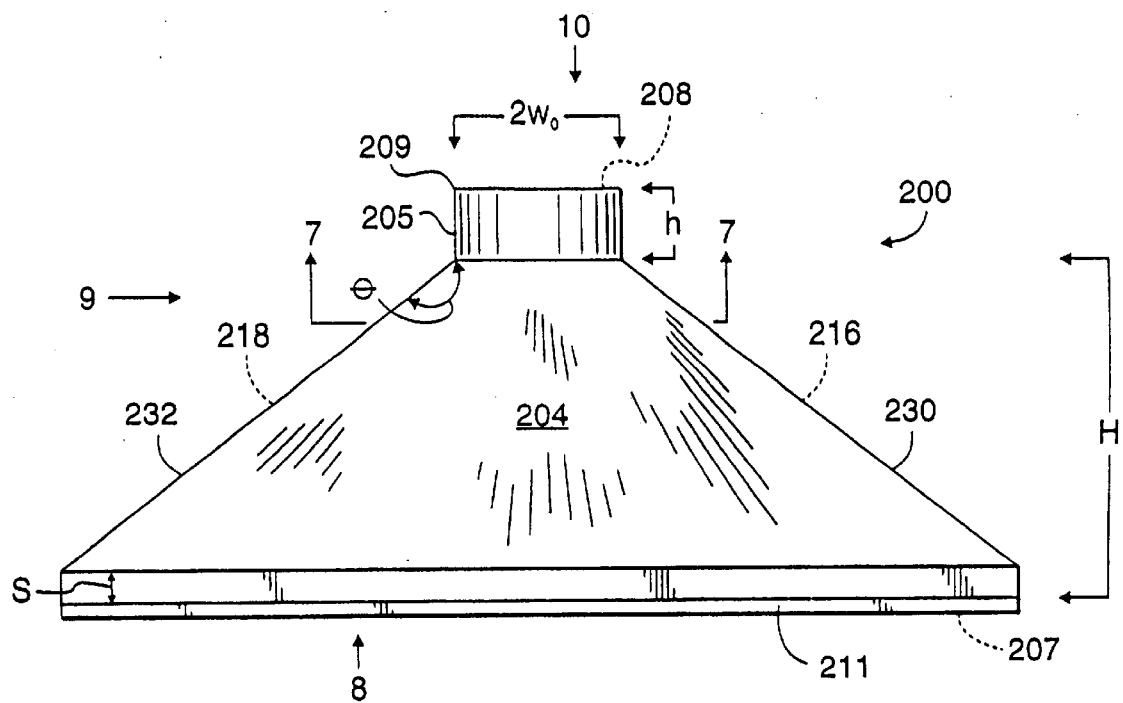
FIG. 6 is a side view of a compression head which is made in accordance with the teachings of a second embodiment of the invention and which is adapted to selectively receive and emit viscous material.
Figure 7:
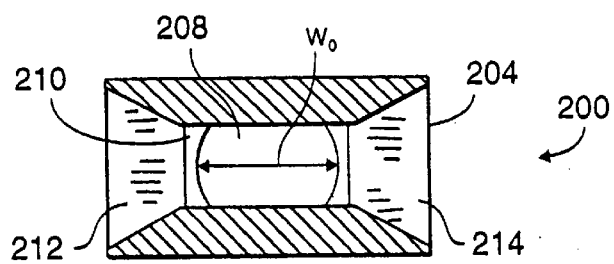
FIG. 7 is a cross-sectional view of the compression head which is shown in FIG. 6 and which is taken along view line 7–7.

4. The bottom surface 207 is extruded along a vertical distance having a value of "s" which is best shown in FIG. 6.

In the most preferred embodiment, a single parameter "W" is chosen for optimization. Particularly, it is assumed, in this non-limiting example of a compression head construction methodology, that a relatively uniform solder paste or viscous material velocity profile exists at the aperture 206. Hence, an optimization of "the geometry" (e.g., an optimization of the structure required to achieve a reasonable or substantially uniform velocity and pressure profile for at the outlet 206) is accomplished.

The flow in the compression-printing head 200 is substantially a non-Newtonian type of viscous flow with negligible inertia type effects. Particularly, Applicants have found that this flow can be described by the following momentum equation:

$$\nabla p = \nabla \cdot (v \nabla \mu) \quad \text{Equation 2}$$

where "p" is the pressure of the viscous material, "$\mu$" is the dynamic viscosity of the viscous material and "V" is the velocity of the viscous material. In one embodiment, this equation is mathematically averaged across the thickness "γ" of the received viscous material which is resident within the compression head 200. In one non-limiting construct, it is assumed that the received viscous material is contained across the length of aperture 206. Hence, the foregoing equation is evaluated and the respective equation generated/provided values are mathematically averaged across distance "2L".

From the design objective, the flow pattern of the received viscous material is approximately radial from the inlet 208 to the outlet 206. Applicants have found that, except at the cavity wall regions 230, 232, at any height within head 200 (characterized as the "z" direction and defined as the distance along an axis extending from aperture 206 into cavity 204), the viscous material velocity should be at most a weak function of the horizontal or "x" location of the received viscous material within the head 200. Hence, in one embodiment, the viscous material velocity is approximated to be substantially independent of the "x" location within the compression head 200. From known continuity requirements, the following equation is developed:

$$\mu^{(z)} = \mu 0 \frac{w_0^2}{(w_0 + \tan\theta \cdot z)\left(w_0 - \frac{w_0 - t}{H}z\right)} \quad \text{Equation 3}$$

where "$\mu 0$" is the average velocity of the received viscous material at the neck 205 near the inlet aperture 208 (e.g. when "z"=0).

In order to achieve such a velocity, the pressure is required to be reasonably uniform at the outlet 206. Since the pressure at the neck 205, near the inlet 208, is also relatively uniform (caused by a pneumatic driven piston or any other conventional device used to selectively supply the viscous material to the head 200), the pressure drop from the neck 205 to the outlet 206 should also be substantially uniform. The pressure "drop" can be estimated by integrating the momentum equation, resulting in the following integral function:

$$\Delta p \approx \int_0^H \frac{v \cdot \mu(z)}{\cos\alpha}\left(\frac{1}{w(x,z)^2} + \frac{1}{(w_0 + \tan\theta \cdot z)^2}\right)dz = I(\alpha) \quad \text{Equation 4}$$

where "$\alpha$" is the angle between a flow path of interest and the vertical or "z" direction and where:

$$w(x,z) = w_0 - \frac{w_0 - t}{H}z + \left(\frac{W - w_0}{L - w_0}\right)\left(1 - \frac{z}{H}\right)(x - w_0) \text{ and } x = \quad \text{Equation 5}$$

$$w_0 + \tan_\alpha \cdot z.$$

The non-Newtonian viscosity is chosen according to an empirical Ellis model fitted from experimental data, such as and without limitation as follows:

$$v(x,z) = \frac{2\mu_0}{1 + \sqrt{1 + \alpha\gamma(x,z)}} \quad \text{Equation 6}$$

in which "$\mu 0$" and "$\alpha$" are empirically derived constants, and the shear rate "$\gamma(x,z)$" is approximated by the relationship of $\gamma(x,z)=\mu(z)/w(x,z)$.

Finally, the optimization parameter "W" to achieve the objective of uniform exit velocity is fixed by the following relationship: $I(\theta)=I(0)$ Thus, according to this embodiment, the parameter "W" is varied until this condition is satisfied. Hence, the pressure drop at the center flow path is the same as that of the flow path at the edges 230, 232 along the side wall. Accordingly, desired uniform velocity is achieved.

It is to be understood that the embodiments of the invention which have been described are merely illustrative of some applications of the principles of the invention. Numerous modifications may be made by those skilled in the art without departing from the true spirit and scope of the invention.

What is claimed is:

1. A compression head for receiving and dispensing viscous material, comprising:
    a chamber defining a receiving aperture with a first length and a first width, and a dispensing aperture having a central portion and two flared portions cooperating to define a generally bow-tie cross-section with a second length from one flared portion through the central portion to the other flared portion and a second width across the central portion, the second length being greater than the first length, and the second width begin less than the first width; and
    a blade positioned in close proximity to the dispensing aperture.

2. The compression head of claim 1 wherein the receiving aperture is generally rectangular-shaped.

3. The compression head of claim 2 wherein the receiving aperture is generally square-shaped.

4. An apparatus for dispensing viscous material, comprising:
    a pressure source;
    a reservoir connected to the pressure source and adapted to contain a viscous material;
    a chamber defining a receiving aperture with a first length and a first width, and a dispensing aperture having a central portion and two flared portions cooperating to define a generally bow-tie cross-section with a second length from one flared portion through the central portion to the other flared portion and a second width across the central portion, the chamber being connected to the reservoir, the second length being greater than the first length, and the second width begin less than the first width; and
    a blade positioned in close proximity to the dispensing aperture.

* * * * *

UNITED STATES PATENT AND TRADEMARK OFFICE
CERTIFICATE OF CORRECTION

PATENT NO.    : 6,395,087 B1
DATED         : May 28, 2002
INVENTOR(S)   : Jairazbhoy et al.

It is certified that error appears in the above-identified patent and that said Letters Patent is hereby corrected as shown below:

<u>Title page,</u>
Item [57], ABSTRACT,
Line 3, "compress on head cap" should be -- compression head cap --.

Signed and Sealed this

Twenty-seventh Day of August, 2002

*Attest:*

*Attesting Officer*

JAMES E. ROGAN
*Director of the United States Patent and Trademark Office*